United States Patent
Yoshida et al.

(10) Patent No.: US 7,344,967 B2
(45) Date of Patent: Mar. 18, 2008

(54) METHOD FOR FORMING AN ELECTRODE

(75) Inventors: Kazuhiro Yoshida, Aichi-ken (JP);
Yukitaka Hasegawa, Aichi-ken (JP);
Koji Kaga, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 11/238,163

(22) Filed: Sep. 29, 2005

(65) Prior Publication Data
US 2006/0073692 A1  Apr. 6, 2006

(30) Foreign Application Priority Data
Sep. 30, 2004  (JP) ............... 2004-288974

(51) Int. Cl.
*H01L 21/44* (2006.01)
(52) U.S. Cl. ............... 438/608; 257/E25.032
(58) Field of Classification Search ........ 438/608; 257/E25.032
See application file for complete search history.

(56) References Cited

U.S. PATENT DOCUMENTS

| | | | | |
|---|---|---|---|---|
| 4,482,216 A | * | 11/1984 | Hashimoto et al. | ......... 359/268 |
| 5,157,540 A | * | 10/1992 | Kidai et al. | ................. 359/273 |
| 6,351,068 B2 | * | 2/2002 | Yamazaki et al. | ........ 313/506 |
| 2004/0206961 A1 | * | 10/2004 | Yamada et al. | ............... 257/79 |
| 2006/0225614 A1 | * | 10/2006 | Hagiwara et al. | ...... 106/287.19 |

FOREIGN PATENT DOCUMENTS

| | | |
|---|---|---|
| JP | 11-040854 | 2/1999 |
| JP | 2001-210867 | 8/2001 |
| JP | 2003-17748 | 1/2003 |
| KR | 10-2004-0065503 | 7/2004 |

OTHER PUBLICATIONS

Korean Office Action dated Jul. 26, 2004 (with partial English translation).

* cited by examiner

*Primary Examiner*—Michelle Estrada
(74) *Attorney, Agent, or Firm*—McGinn IP Law Group, PLLC

(57) ABSTRACT

In a semiconductor light-emitting device, a buffer layer, a un-doped GaN layer, a high carrier concentration $n^+$-layer, an n-type layer, an emission layer, a p-type layer, and a p-type contact layer are deposited in sequence on a sapphire substrate. The semiconductor light-emitting device includes a light-transparent electrode made of indium tin oxide (ITO) which is deposited in the low pressure vacuum chamber flowing at least oxygen gas through electron beam deposition or ion plating treatment, and a thermal process is carried out.

13 Claims, 1 Drawing Sheet

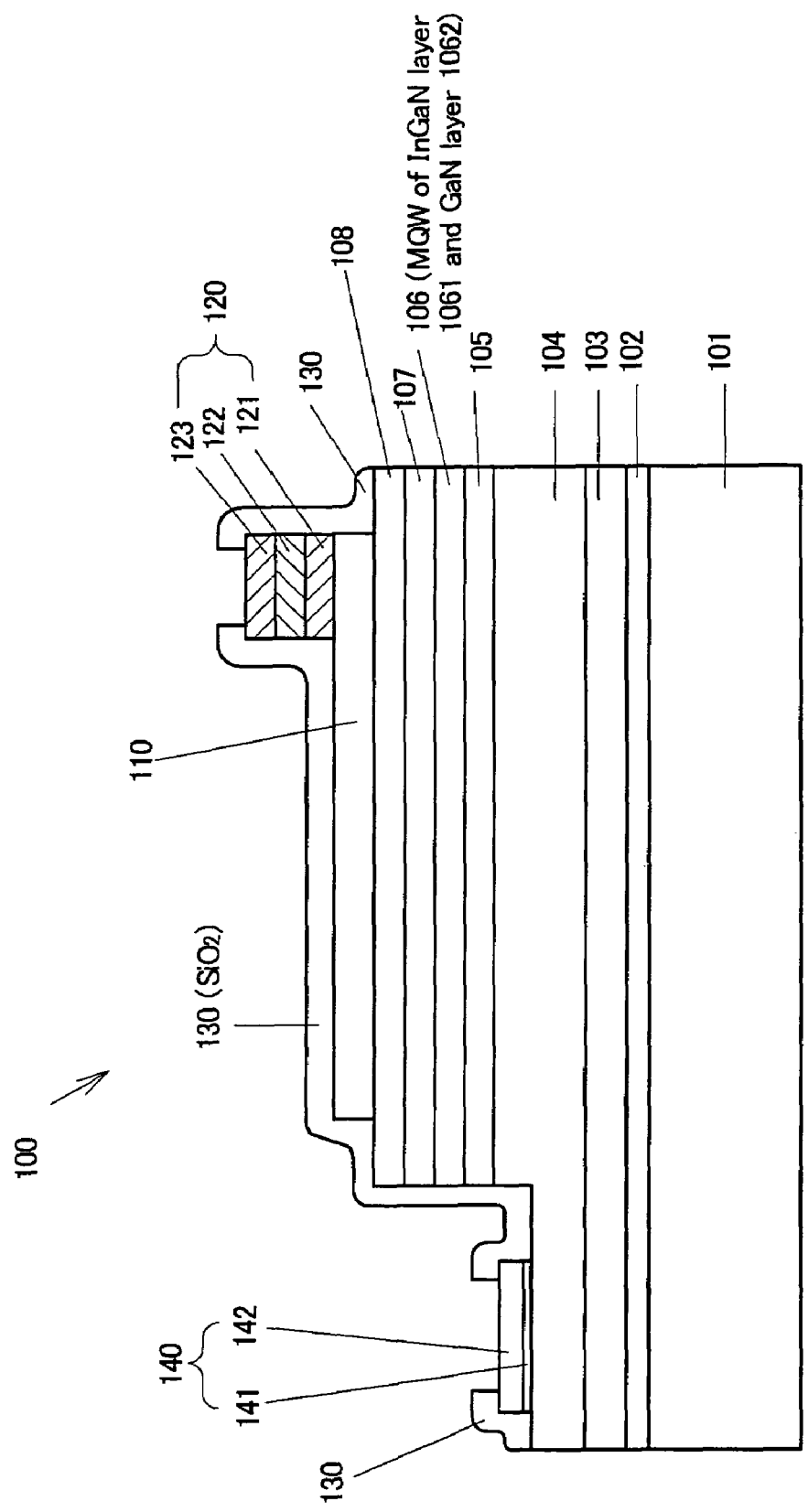

METHOD FOR FORMING AN ELECTRODE

This is a patent application based on a Japanese patent application No. 2004-288974 which was filed on Sep. 30, 2004, and which is incorporated herein by reference.

TECHNICAL FIELD

The present invention relates to a method for forming an electrode of a semiconductor device which is formed by depositing a Group III nitride compound semiconductor. Especially, the present invention relates to a light-transparent electrode, i.e., luminous transparent electrode, made of indium tin oxide (ITO).

BACKGROUND ART

Presently, a Group III nitride compound semiconductor device is generally grown on a non-conductive sapphire substrate, and comprises an n-electrode and a p-electrode both of which are formed at a semiconductor device layer side. Here, a lateral type of Group III nitride compound semiconductor device has a thin-film light-transparent electrode made of, for example, an alloyed gold (Au) and cobalt (Co) on the surface of a p-type layer, and outputs lights from the side on which the electrode is formed. The Au/Co thin-film light-transparent electrode, however, has poor light-transparency of about 60%, and extract efficiency of light is not adequate.

Alternatively, indium tin oxide (ITO) may be used to form the light-transparent electrode on the Group III nitride compound semiconductor device.

[Patent Document 1] Japanese Patent No. 3394488
[Patent Document 2] Japanese Patent Laid-open No. 2003-17748

DISCLOSURE OF THE INVENTION

Problems to be Solved

With respect to indium tin oxide (ITO), however, its characteristic is not yet found out when it is employed in a Group III nitride compound semiconductor light-emitting device, and it needs to develop the optimum condition for forming an electrode by using indium tin oxide (ITO). In order to solve the problems, the present invention aims to provide a method for forming an electrode made of indium tin oxide (ITO) as a light-transparent electrode in a Group III nitride compound semiconductor light-emitting device.

Means to Solve the Problems

That is, a first aspect of the present invention is a method for forming an electrode of a semiconductor device which is formed by depositing Group III nitride compound semiconductor layers. The electrode comprises indium tin oxide (ITO), and indium tin oxide (ITO) is deposited in the low pressure vacuum chamber flowing at least oxygen gas by electron beam deposition or ion plating treatment.

A second aspect of the present invention is that the electrode is baked after forming the indium tin oxide (ITO) film. A third aspect of the present invention is that forming the indium tin oxide (ITO) film is carried out in the oxygen ambient at 0.01 Pa or more.

A fourth aspect of the present invention is that a pad electrode for wire bonding is formed on the transparent electrode. And a film comprising at least one selected from the group consisting of nickel (Ni), titanium (Ti), chromium (Cr), and aluminum (Al) is formed as the bottom layer of the pad electrode.

Through employment of the aforementioned aspects of the present invention, the aforementioned drawbacks can be overcome effectively and rationally.

EFFECT OF THE INVENTION

Effects to be obtained by the present invention are explained as follows.

As described below, the inventors of the present invention invented to form the optimum light-transparent electrode by depositing ITO through electron beam deposition or ion plating treatment in the low pressure oxygen ambient. The inventors of the present invention also invented that an electrode having high light-transmittivity and low resistivity can be obtained by heating to bake the ITO after that deposition treatment. The inventors of the present invention further invented that an electrode having high transparency and low resistivity can be obtained by not carrying out baking when the ITO is formed in the oxygen ambient of 0.06 Pa or more.

A pad electrode for wire bonding which contacts to the light-transparent electrode made of ITO needs to be formed, but the inventors of the present invention found that adhesiveness of the ITO electrode can be improved by forming at least one of nickel (Ni), titanium (Ti), chromium (Cr), and aluminum (Al) between a thick film electrode made of Au and ITO electrode.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 1 is a sectional view of a light-emitting semiconductor device 100 according to the second embodiment of the present invention.

BEST MODE FOR CARRYING OUT THE INVENTION

Embodiments of the present invention will next be described based on concrete examples. The scope of the present invention, however, is not limited to the embodiment described below.

ITO is the main characteristic of the present invention. The tin (Sn) composition ratio of ITO may preferably be in a range from 2% to 20%, and thickness of ITO may preferably in a range from 10 nm to 10 µm. When thickness of ITO is less than 10 nm, diffusion of electric current becomes insufficient and it tends to be peeled off. When thickness of ITO is larger than 10 µm, its luminous transparency becomes worse. Thickness of ITO may preferably in a range from 100 nm to 5 µm, further preferably from 200 nm to 2 µm.

Oxygen pressure in a process of depositing the ITO film may preferably in a range from 0.01 Pa to 10 Pa, and more preferably in a range from 0.03 Pa to 2 Pa, further preferably in a range from 0.05 Pa to 1 Pa. When oxygen pressure is 0.01 Pa or more, an electrode having smaller resistivity can be formed and luminous transparency of 80% or more can be obtained after carrying out heating. When oxygen pressure is 0.06 Pa or more, the electrode can have luminous transparency of 90% or more without carrying out heating process. The heating process may be carried out at the temperature from 300° C. to 1000° C. When the temperature for the heating treatment is less than 300° C., baking cannot be carried out sufficiently. When the temperature is more than 1000° C., device characteristic of the semiconductor device may be deteriorated. More preferable temperature for heating may be in a range from 500° C. to 900° C., further preferably from 600° C. to 800° C. The heating treatment may preferably be carried out in the inert gas ambient, especially in the nitrogen.

The pad electrode for wire bonding may preferably comprise a thick film made of gold (Au). Thickness of the Au thick film is arbitrary in a range from 0.5 µm to 3 µm. When the pad electrode is mainly made of gold (Au), it may have larger adhesiveness with the light-transparent electrode made of ITO by forming nickel (Ni), titanium (Ti), chromium (Cr), or aluminum (Al) between the pad electrode made of Au and the light-transparent electrode made of ITO. Adhesiveness between the pad electrode and the light-transparent electrode may become larger especially when nickel (Ni) is employed.

A Group III nitride compound semiconductor light-emitting device of the present invention may have arbitrary structure. The light-emitting device may be a light-emitting diode (LED), a laser diode (LD), a photo-coupler or other arbitrary light-emitting device. Especially, the Group III nitride compound semiconductor light-emitting diode of the present invention may be manufactured by an arbitrary method.

A substrate used through crystal growth may comprise different materials such as sapphire, spinel ($MgAl_2O_4$), silicon (Si), carbon silicide (SiC), zinc oxide (ZnO), magnesium oxide (MgO), manganese oxide (MnO), or a Group III nitride compound monocrystal. As a method for crystal growing a Group III nitride compound semiconductor layer, molecular beam epitaxy (MBE), metal organic chemical vapor deposition (MOCVD), Hydride vapor phase epitaxy (HVPE), and liquid phase epitaxy may be useful.

When an emission layer has multiple quantum-well structure, it may comprise a well layer comprising a Group III nitride compound semiconductor $Al_xGa_yIn_{1-x-y}N$ ($0 \leq x<1$, $0<y \leq 1$) including at least indium (In). The emission layer may comprise, for example, a doped or undoped $Ga_yIn_{1-y}N$ ($0<y \leq 1$) well layer and a barrier layer which is made of a Group III nitride compound semiconductor AlGaInN having arbitrary compositions and has larger band gap than that of the well layer. As a preferable example, the emission layer comprises an undoped $Ga_yIn_{1-y}N$ ($0<y \leq 1$) well layer and an undoped GaN barrier layer.

The Group III nitride compound semiconductor layer such as an electrode forming layer may comprise at least a binary, ternary, or quaternary Group III nitride compound semiconductor represented by $Al_{1-x-y}Ga_yIn_xN$ ($0 \leq x \leq 1$, $0 \leq y \leq 1$, $0 \leq 1-x-y \leq 1$). Group III elements (Al, Ga, In) may be partially replaced with boron (B) or thallium (Tl), and nitrogen (N) atoms may be partially replaced with phosphorus (P), arsenic (As), antimony (Sb), or bismuth (Bi).

Further, in order to form an n-type Group III nitride compound semiconductor layer by using those semiconductors, silicon (Si), germanium (Ge), selenium (Se), tellurium (Te), and carbon (C) may be used as an n-type impurity and zinc (Zn), magnesium (Mg), beryllium (Be), calcium (Ca), sulfur (Sr), and barium (Ba) may be used as a p-type impurity.

Through employment of the aforementioned aspects of the present invention, the aforementioned drawbacks can be overcome effectively and rationally.

Embodiment 1

First, the inventors of the present invention carried out the following experiment to show that desired improvement of luminous transparency of the ITO and decrease of sheet resistivity can be obtained by employing a method for forming an electrode according to the present invention. By using a mixture of tin oxide (5%) and indium oxide as a target, 300 nm in thickness of ITO was formed on a sapphire substrate through electron beam deposition. After the atmosphere in the deposition chamber was arranged to be high vacuum of $1 \times 10^{-2}$ Pa or less, oxygen was supplied at 4 different pressures to obtain each ITO. 5 oxygen pressures were: 0.0 Pa (without supplying oxygen), 0.005 Pa, 0.015 Pa, 0.06 Pa, and 0.1 Pa. After forming 4 types of ITO, luminous transparency for blue-color light having wavelength of 470 nm and sheet resistivity were measured. Then each of the ITO was heated for 10 minutes in the nitrogen ambient at the temperature of 400° C., and luminous transparency and sheet resistivity were measured again. Table 1 shows those measurement results. Here, luminous transparency is a relative value when luminous transparency of the sapphire substrate is 100%.

TABLE 1

| Existance of oxygen when ITO is formed | Baking | Luminous transparency (%) | Resustivity ($\Omega/\square$) |
|---|---|---|---|
| No | No | 65 | 100 |
|  | Yes | 100+ | 102 |
| Yes (0.005 Pa) | No | 60 | 24 |
|  | Yes | 90 | 27 |
| Yes (0.015 Pa) | No | 57 | 15 |
|  | Yes | 88 | 16 |
| Yes (0.06 Pa) | No | 93 | 16 |
|  | Yes | 92 | 18 |
| Yes (0.1 Pa) | No | 96 | 14 |
|  | Yes | 96 | 8 |

When the ITO is formed without supplying oxygen, luminous transparency after baking is remarkably different from luminous transparency before baking. That is, luminous transparency before baking is 65% but grows to be 100% after baking. In the meantime, sheet resistivity before baking is 100$\Omega/\square$, which hardly changes after carrying out baking treatment.

When the ITO is formed in the atmosphere including 0.005 Pa of oxygen, luminous transparencies before and after baking are remarkably different with each other. That is, luminous transparency before baking is 60% but grows to be 90% after baking. On the contrary, sheet resistivity before baking hardly changes after baking. Each sheet resistivity before and after baking is around 27$\Omega/\square$, which leaves room for improvement but is comparatively good.

When the ITO is formed in 0.015 Pa of oxygen ambient, luminous transparencies before and after baking are remarkably different with each other. That is, luminous transparency before baking is 57% but grows to be 88% after baking. On the contrary, sheet resistivity before baking hardly changes after baking. Each sheet resistivity before and after baking is around 16$\Omega/\square$, which is quite excellent.

When the ITO is formed in 0.06 Pa of oxygen ambient, both luminous transparency and sheet resistivity before baking hardly change after baking, and both values are quite excellent. That is, luminous transparency is around 93% and sheet resistivity is around 16Ω/□.

When the ITO is formed in 0.1 Pa of oxygen ambient, both luminous transparency and sheet resistivity are quite excellent. That is, each luminous transparency before and after baking is around 96%. Sheet resistivity before baking is 14Ω/□ but is improved to be 8Ω/□ after baking.

These results explain the followings. That is, carrying out baking accelerates recrystallization of the ITO, and that improves its luminous transparency. By forming the ITO in a little amount of oxygen ambient, a stoichiometrically ideal ITO can be obtained and that decreases its resistivity. As a result, a remarkably excellent ITO film as a light-transparent electrode can be formed according to the present invention.

Embodiment 2

FIG. 1 illustrates a sectional view of a semiconductor light-emitting device 100 according to the second embodiment of the present invention. As shown in FIG. 1, the semiconductor light-emitting device 100 comprises about 300 μm in thickness of sapphire substrate 101, on which about 15 nm in thickness of aluminum nitride (AlN) buffer layer 102, about 500 nm in thickness of undoped GaN layer 103, and about 5 μm in thickness of silicon (Si) doped GaN n-type contact layer 104 (high carrier concentration $n^+$-layer) having Si concentration of $1 \times 10^{18}/cm^3$ are deposited.

On the n-type contact layer 104, about 25 nm in thickness of silicon (Si) doped n-type $Al_{0.15}Ga_{0.85}N$ n-type layer 105 having Si concentration of $1 \times 10^{17}/cm^3$ is deposited, and an emission layer 106, which has multiple quantum-well structure and comprises 3 pairs of about 3 nm in thickness of undoped $In_{0.2}Ga_{0.8}N$ well layer 1061 and about 20 nm in thickness of undoped GaN barrier layer 1062, is formed thereon.

On the emission layer 106, 25 nm in thickness of Mg doped p-type $Al_{0.15}Ga_{0.85}N$ p-type layer 107 having Mg concentration of $2 \times 10^{19}/cm^3$ is formed. On the p-type layer 107, 100 nm in thickness of Mg doped p-type contact layer 108 which is made of p-type GaN and has Mg concentration of $8 \times 10^{19}/cm^3$ is formed.

And a light-transparent p-electrode 110 made of ITO and an n-electrode 107 are formed on the p-type contact layer 108 and the n-type contact layer 104, respectively. The light-transparent p-electrode 110 is made of about 300 nm in thickness of ITO which directly contacts to the p-type contact layer 108.

A thick-film p-electrode 120 comprises about 30 nm in thickness of a first layer 121 made of nickel (Ni), about 1.5 μm in thickness of a second layer 122 made of gold (Au), and about 10 nm in thickness of a third layer 123 made of aluminum (Al) deposited on the light-transparent p-electrode 110 in sequence.

An n-electrode 140 having multiple-layer structure comprises about 18 nm in thickness of a first layer 141 made of vanadium (V) and about 100 nm in thickness of a second layer 142 made of aluminum (Al) are deposited on a portion at which the n-type contact layer 104 is exposed.

A semiconductor light-emitting device comprises a sapphire substrate, on which the buffer layer 102, the undoped GaN layer 103, the high carrier concentration $n^+$-layer 104, the n-layer 105, the emission layer 106, the p-type layer 107, the p-type contact layer 108 are formed through epitaxial growth. After carrying out etching to form the n-electrode 140, the following electrode forming processes are carried out.

First, a mask which has a window to form the light-transparent p-electrode (ITO) 110 is formed by using photoresist, and 300 nm in thickness of light-transparent p-electrode 110 made of ITO is formed in 0.06 Pa or less oxygen ambient through electron beam deposition by using a mixture of tin oxide and indium oxide in which tin oxide composition ratio is 5% as a target. Next, baking is carried out for 5 minutes at the temperature of 600° C. in nitrogen ambient.

Then, a mask which has a window to form the thick-film p-electrode 120 is formed by using photoresist, and 30 nm in thickness of first layer 121 made of nickel (Ni), about 1.5 μm in thickness of second layer 122 made of gold (Au), and 10 nm in thickness of third layer 123 made of aluminum (Al) are formed on the light-transparent p-electrode 110 in sequence. Then the photoresist layer is removed.

Similarly, a mask which has a window to form the n-electrode 140 is formed through photoresist, and about 18 nm in thickness of first layer 141 made of vanadium (V) and about 100 nm in thickness of second layer 142 made of aluminum (Al) are formed on the portion at which the high carrier concentration $n^+$-layer 103 is exposed. Then the photoresist layer is removed.

Then the light-transparent p-electrode (ITO) 110, the thick-film p-electrode 120, and the n-electrode 140 are annealed. And then a passivation film 130 made of $SiO_2$ is formed.

COMPARATIVE EXAMPLE

In this comparative embodiment, the light-transparent p-electrode (ITO) 110 in the above embodiment is replaced with a thin-film electrode in which 9 Å in thickness of Co, 29 Å in thickness of Au, 9 Å in thickness of Co, and 30 Å in thickness of Au are deposited in sequence, and 40 nm in thickness of Au, 30 nm in thickness of Cr, 650 nm in thickness of Au, and 10 nm in thickness of Al are deposited in place of the thick-film p-electrode 120 in the above embodiment. The thus-formed semiconductor light-emitting device of this comparative embodiment is manufactured and its device characteristics are compared with those of the semiconductor light-emitting device 100 of the above embodiment. The semiconductor light-emitting device in this embodiment is mounted to an Ag stem and is covered by transparent paste.

The semiconductor light-emitting device in the comparative embodiment comprising a transparent electrode made of alloyed 4 layers Au/Co/Au/Co laminated in sequence has driving voltage of 3.15V, luminous intensity of 77 mcd, and total radiation flux of 3.4 mW, while the semiconductor light-emitting device 100 of the present invention has driving voltage of 3.27V, luminous intensity of 146 mcd, and total radiation flux of 7.6 mW. That is, compared with the semiconductor light-emitting device comprising the Au/Co thin-film transparent electrode, driving voltage hardly changes while luminous intensity and total radiation flux remarkably improve in the semiconductor light-emitting device of the present invention comprising the light-transparent electrode made of ITO.

The present invention has been described in detail with reference to the above embodiments serving as most practical and appropriate examples. However, the present invention is not limited to these embodiments, and appropriate modifications and applications can be made without deviating from the scope of the present invention.

While the present invention has been described with reference to the above embodiments as the most practical and optimum ones, the present invention is not limited thereto, but may be modified as appropriate without departing from the spirit of the invention.

The present invention comprises all the contents in the priority claiming Japanese patent application No. 2004-288974.

The invention claimed is:

1. A method of forming a Group III nitride light-emitting device, the method comprising:

forming n-type layers including an n-type contact layer, an emission layer and n-type layers including a p-type contact layer on a substrate;

forming a transparent electrode on said p-type contact layer by depositing indium tin oxide (ITO) in a low pressure vacuum chamber flowing at least oxygen gas at an oxygen pressure of 0.06 Pa to 2 Pa through electron beam deposition or ion plating treatment on said p-type contact layer; and baking said electrode at a temperature of 300° C. to 1000° C. in a nitrogen gas after depositing said indium tin oxide (ITO), wherein said transparent electrode has a luminous transparency not less than 92% and a sheet resistivity not larger than 18 $\Omega/\square$.

2. The method of forming a Group III nitride light-emitting device according to claim 1, further comprising:

forming a pad electrode for wire bonding on said transparent electrode comprising indium tin oxide (ITO); and forming a film comprising at least one selected from the group consisting of nickel (Ni), titanium (Ti), chromium (Cr), and aluminum (Al) as a bottom layer of said pad electrode.

3. The method of forming a Group III nitride light-emitting device according to claim 1, wherein said temperature ranges from 500° C. to 900° C.

4. The method of forming a Group III nitride light-emitting device according to claim 1, wherein said temperature ranges from 600° C. to 800° C.

5. The method of forming a Group III nitride light-emitting device according to claim 1, wherein said oxygen pressure ranges from 0.05 Pa to 1 Pa.

6. A method of forming a Group III nitride light-emitting device, the method comprising:

forming n-type layers including an n-type contact layer, an emission layer and n-type layers including a p-type contact layer on a substrate; and forming a transparent electrode on said p-type contact layer by depositing indium tin oxide (ITO) in a low pressure vacuum chamber flowing at least oxygen gas at an oxygen pressure of 0.06 Pa or more through electron beam deposition or ion plating treatment on said p-type contact layer, wherein said transparent electrode has a luminous transparency not less than 96% and a sheet resistivity not larger than 14 $\Omega/\square$.

7. The method of forming a Group III nitride light-emitting device according to claim 6, wherein said transparent electrode is baked at a temperature of 300° C. or more after depositing said indium tin oxide (ITO).

8. The method of forming a Group III nitride light-emitting device according to claim 6, wherein said transparent electrode is baked at a temperature of 300° C. to 1000° C. after depositing said indium tin oxide (ITO), and wherein said transparent electrode has a luminous transparency not less than 96% and a sheet resistivity not larger than 8 $\Omega/\square$.

9. The method of forming a Group III nitride light-emitting device according to claim 5, wherein said transparent electrode is baked at a temperature of 500° C. to 900° C. after depositing said indium tin oxide (ITO).

10. The method of forming a Group III nitride light-emitting device according to claim 6, wherein said transparent electrode is baked at a temperature of 500° C. to 900° C. after depositing said indium tin oxide (ITO).

11. The method of forming a Group III nitride light-emitting device according to claim 5, further comprising:

forming a pad electrode of wire bonding on said transparent electrode comprising indium tin oxide (ITO); and forming a film comprising at least one selected from the group consisting of nickel (Ni), titanium (Ti), chromium (Cr), and aluminum (Al) as a bottom layer of said pad electrode.

12. The method of forming a Group III nitride light-emitting device according to claim 6, further comprising:

forming a pad electrode for wire bonding on said transparent electrode comprising indium tin oxide (ITO); and forming a film comprising at least one selected from the group consisting of nickel (Ni), titanium (Ti), chromium (Cr), and aluminum (Al) as a bottom layer of said pad electrode.

13. The method of forming a Group III nitride light-emitting device according to claim 10, further comprising:

forming a pad electrode for wire bonding on said transparent electrode comprising indium tin oxide (ITO); and forming a film comprising at least one selected from the group consisting of nickel (Ni), titanium (Ti), chromium (Cr), and aluminum (Al) as the bottom layer of said pad electrode.

* * * * *